(12) United States Patent
Jiang et al.

(10) Patent No.: US 12,369,297 B2
(45) Date of Patent: Jul. 22, 2025

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Yi Jiang, Hefei (CN); Deyuan Xiao, Hefei (CN); Weiping Bai, Hefei (CN); Yunsong Qiu, Hefei (CN); Guangsu Shao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 517 days.

(21) Appl. No.: 17/934,628

(22) Filed: Sep. 23, 2022

(65) Prior Publication Data

US 2024/0008246 A1    Jan. 4, 2024

(30) Foreign Application Priority Data

Jun. 30, 2022    (CN) .......................... 202210756154.8

(51) Int. Cl.
*H10B 12/00*    (2023.01)
*G11C 5/06*    (2006.01)

(52) U.S. Cl.
CPC ......... *H10B 12/0335* (2023.02); *G11C 5/063* (2013.01); *H10B 12/05* (2023.02); *H10B 12/315* (2023.02)

(58) Field of Classification Search
CPC .. H10B 12/0335; H10B 12/05; H10B 12/315; H10B 12/033; H10B 12/03; H10B 12/30; G11C 5/063; H01L 21/76897; H01L 23/5386
See application file for complete search history.

(56) References Cited

U.S. PATENT DOCUMENTS

| 7,781,285 | B2 | 8/2010 | Kim et al. | |
| 2013/0147013 | A1* | 6/2013 | Ode | H10B 12/0335 257/532 |
| 2015/0340368 | A1* | 11/2015 | Oshima | H10B 12/033 438/430 |
| 2015/0364366 | A1* | 12/2015 | Kim | H01L 21/76816 438/666 |
| 2023/0079234 | A1* | 3/2023 | Wang | H01L 21/32139 257/209 |

* cited by examiner

*Primary Examiner* — Yasser A Abdelaziz
(74) *Attorney, Agent, or Firm* — Kilpatrick Townsend & Stockton LLP

(57) ABSTRACT

The present disclosure provides a semiconductor structure and a manufacturing method thereof. The method of manufacturing a semiconductor structure includes: providing a base including a first region and a second region, where a plurality of active pillars are arranged at intervals in the base located in the first region; forming a first dielectric layer on the base, where the first dielectric layer covers the plurality of active pillars; forming a first mask layer with a first mask pattern on the first dielectric layer; forming a second mask layer with a second mask pattern on the first mask layer; forming a third mask layer with a third mask opening, where the third mask opening is used to expose the first region; and removing part of the first dielectric layer by using the first mask layer, the second mask layer, and the third mask layer as a mask.

14 Claims, 13 Drawing Sheets

3 (a)　　　　　　　3 (b)

3 (c)　　　　3 (d)　　　　3 (e)

SEMICONDUCTOR STRUCTURE AND MANUFACTURING METHOD THEREOF

CROSS-REFERENCE TO RELATED APPLICATION

This application claims the priority of Chinese Patent Application No. 202210756154.8, submitted to the Chinese Intellectual Property Office on Jun. 30, 2022, the disclosure of which is incorporated herein in its entirety by reference.

TECHNICAL FIELD

Embodiments of the present disclosure relate to the technical field of semiconductors, and in particular to a semiconductor structure and a manufacturing method thereof.

BACKGROUND

With continuous development of semiconductor technologies and storage technologies, electronic devices continuously become smaller and more integrated. A dynamic random access memory (DRAM) is widely used in various electronic devices due to its high storage density and fast reading/writing speed. The DRAM usually includes many repeated memory cells, and each of the memory cells includes a capacitor and a transistor. The capacitor is connected to a source and a drain of the transistor through a capacitive contact structure.

In related art, a dielectric layer usually needs to be formed on a base and a contact hole running through the dielectric layer needs to be formed. A hole bottom of the contact hole extends into the base to expose the source or the drain of the transistor. Subsequently, a conductive material is deposited in the contact hole to form a capacitive contact structure.

However, a process of forming the contact hole is relatively complex, increasing manufacturing costs of a semiconductor structure.

SUMMARY

In view of the above problem, embodiments of the present disclosure provide a semiconductor structure and a manufacturing method thereof.

A first aspect of the embodiments of the present disclosure provides a method of manufacturing a semiconductor structure, including:
  providing a base, where the base includes a first region and a second region connected to the first region, and a plurality of active pillars are arranged at intervals in the base located in the first region;
  forming a first dielectric layer on the base, where the first dielectric layer covers the plurality of active pillars;
  forming a first mask layer with a first mask pattern on the first dielectric layer, where the first mask pattern is used to expose all active pillars located in a same second direction;
  forming a second mask layer with a second mask pattern on the first mask layer, where the second mask pattern is used to expose all active pillars located in a same first direction;
  forming a third mask layer with a third mask opening, where the third mask opening is used to expose the first region; and
  removing part of the first dielectric layer by using the first mask layer, the second mask layer, and the third mask layer as a mask, to form a plurality of contact holes distributed in an array in the first dielectric layer, where each of the contact holes exposes a top surface of one of the active pillars.

A second aspect of the embodiments of the present disclosure provides a semiconductor structure, where the semiconductor structure is manufactured by using the method of manufacturing a semiconductor structure according to the first aspect; and
  the semiconductor structure includes:
  a base, where the base includes a first region and a second region connected to the first region, a plurality of active pillars are arranged at intervals in the base located in the first region, and an active region is provided in the base located in the second region;
  a plurality of capacitive contact structures, where the plurality of capacitive contact structures are in a one-to-one correspondence with the plurality of active pillars, and the capacitive contact structure is provided on the active pillar; and
  a conductive structure, where the conductive structure is provided in the active region and is electrically connected to the active region, and the conductive structure and the capacitive contact structure are of a same structure.

In addition to the technical problems solved by the embodiments of the present disclosure, the technical features constituting the technical solutions and the beneficial effects brought about by the technical features of these technical solutions, other technical problems to be solved by the semiconductor structure and the manufacturing method thereof in the embodiments of the present disclosure, other technical features included in the technical solutions and beneficial effects brought about by these technical features will be described in further detail in the detailed description.

BRIEF DESCRIPTION OF THE DRAWINGS

To describe the technical solutions in the embodiments of the present disclosure or in the prior art more clearly, the following briefly describes the drawings required for describing the embodiments or the prior art. Apparently, the drawings in the following description show some embodiments of the present disclosure, and those of ordinary skill in the art may still derive other drawings from these drawings without creative efforts.

DETAILED DESCRIPTION

As described in the background, the manufacturing of the contact hole in the related technologies has the problem of a complex process. The inventors have found through research that, the reason for such a problem is that a plurality of times of masks are usually required in the manufacturing process of forming a contact hole in the related technologies. For example, a mask layer needs to be formed on a silicon oxide layer and the mask layer needs to be patterned, such that the mask layer covers a peripheral circuit region and exposes an array region. Subsequently, a partial thickness of the silicon oxide layer is removed by using the mask layer as a mask, and then a first insulating layer is formed through a deposition process. Next, three times of mask processes are required to define a position of a first contact hole used to form a connection pad in the first insulating layer. Then, two more times of mask processes are required to define a position of a second contact hole used to form a conductive plug in the first insulating layer. The first contact hole communicates with the second contact hole, such that the subsequently formed conductive plug and connection pad are connected and constitute a capacitive contact structure.

In view of the foregoing technical problem, the embodiments of the present disclosure provide a semiconductor structure and a manufacturing method thereof, where positions at which contact holes are formed are directly defined through three times of mask processes, and part of a first dielectric layer is removed to form a plurality of contact holes distributed in an array in the first dielectric layer. The present disclosure reduces a quantity of times of masking process and simplifies a manufacturing process of the contact holes, thereby reducing manufacturing costs of the semiconductor structure.

To make the objectives, features and advantages of the embodiments of the present disclosure clearer, the technical solutions in the embodiments of the present disclosure are described clearly and completely below with reference to the drawings in the embodiments of the present disclosure. Apparently, the described embodiments are merely some rather than all of the embodiments of the present disclosure. All other embodiments obtained by those of ordinary skill in the art based on the embodiments of the disclosure without creative efforts shall fall within the protection scope of the present disclosure.

The semiconductor structure is not limited in this embodiment. That the semiconductor structure is a DRAM is used as an example below for description, but this embodiment is not limited thereto. Alternatively, the semiconductor structure in this embodiment may be other structures.

Figure 1:
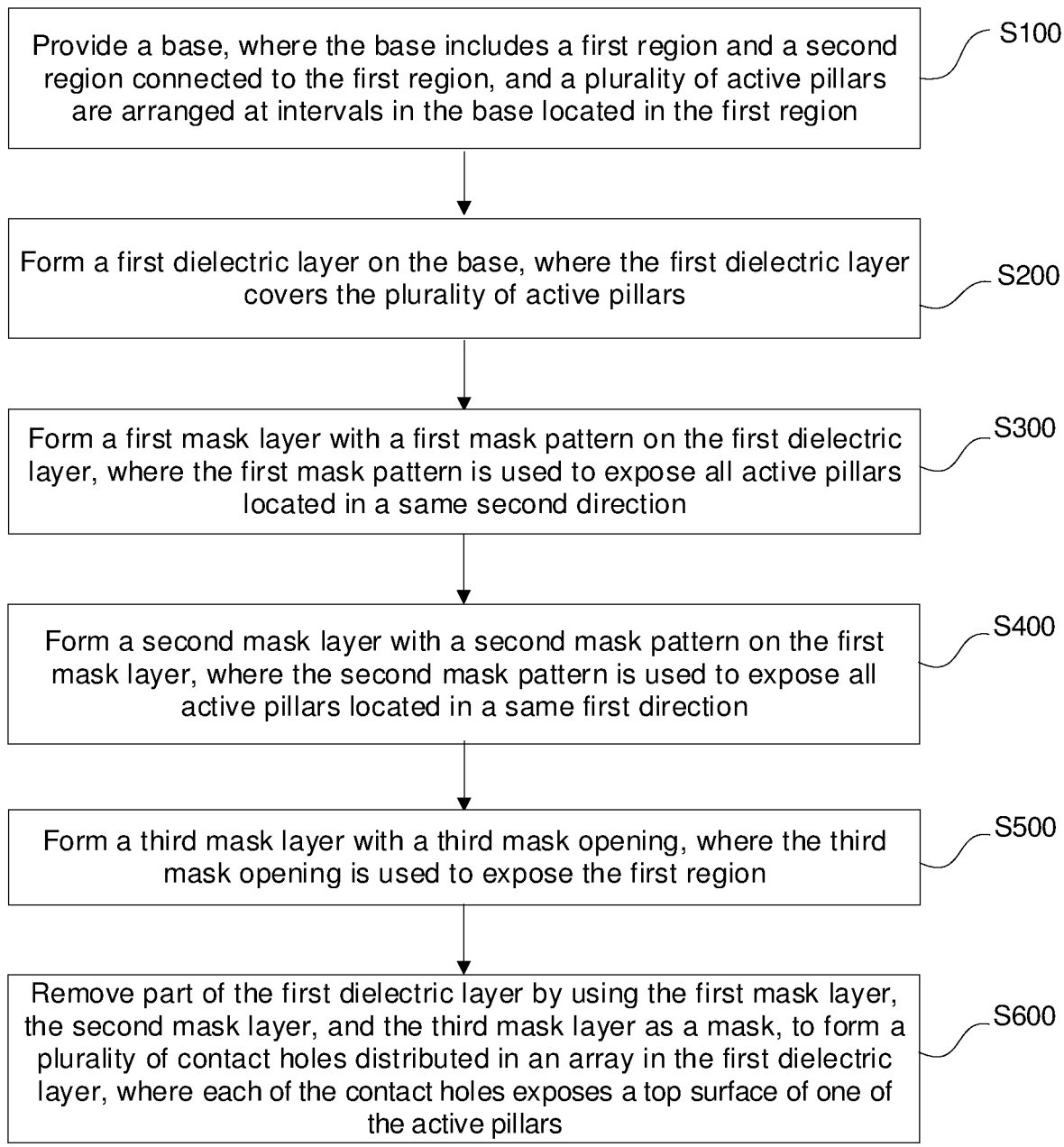
FIG. 1 is a process flowchart of a method of manufacturing a semiconductor structure according to an embodiment of the present disclosure.

Referring to FIG. 1, an embodiment of the present disclosure provides a method of manufacturing a semiconductor structure, including the following steps:

Step S100: Provide a base, where the base includes a first region and a second region connected to the first region, and a plurality of active pillars are arranged at intervals in the base located in the first region.

Figure 2:
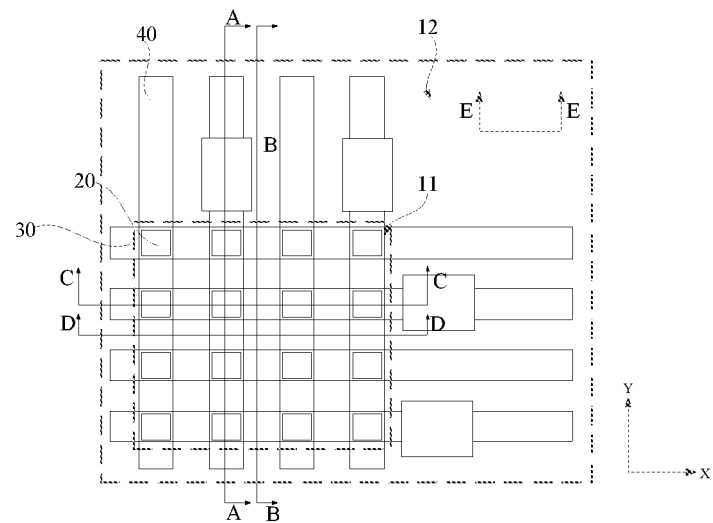
FIG. 2 is a top view of a semiconductor structure according to an embodiment of the present disclosure.

FIG. 2 is a top view of a semiconductor structure according to an embodiment of the present disclosure. WLs 30 and BLs 40 are formed in the semiconductor structure. The WLs 30 extend along a first direction. The BLs 40 extend along a second direction. There is an included angle between the first direction and the second direction. For example, the first direction may be perpendicular to the second direction. Specifically, referring to FIG. 2, the BLs 40 extend along a vertical direction (direction Y), the WLs 30 extend along a horizontal direction (direction X), and gate structures are formed in the WLs 30. The WLs 30 or the BLs 40 may be straight lines or may be fold lines.

To facilitate subsequent detailed description of the accompanying drawings corresponding to each process step during manufacturing of the semiconductor structure, the following are illustrated in cross-sectional views at different locations in FIG. 2. Specifically, a cross section taken along A-A is parallel to an extension direction of the BLs 40 and located on the BLs 40, and is denoted as legend n(a). A cross section taken along B-B is parallel to the extension direction of the BLs 40 and located between adjacent BLs 40, and is denoted as legend n(b). A cross section taken along C-C is parallel to an extension direction of the WLs 30 of and located on the WLs 30, and is denoted as legend n(c). A cross section taken along D-D is parallel to the extension direction of the WLs 30 and located between adjacent WLs 30, and is denoted as legend n(d). A cross section taken along E-E is parallel to the extension direction of the WLs 30 and located in a second region 12, and is denoted as legend n(e).

Figure 3:
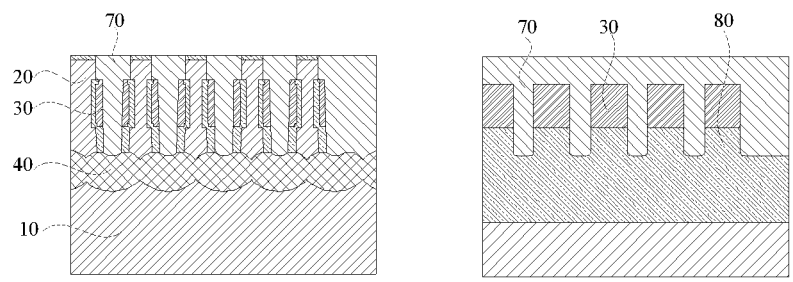
FIG. 3 is a cross-sectional view of a base in each of directions A-A, B-B, C-C, D-D, and E-E according to an embodiment of the present disclosure.
Figure 3:
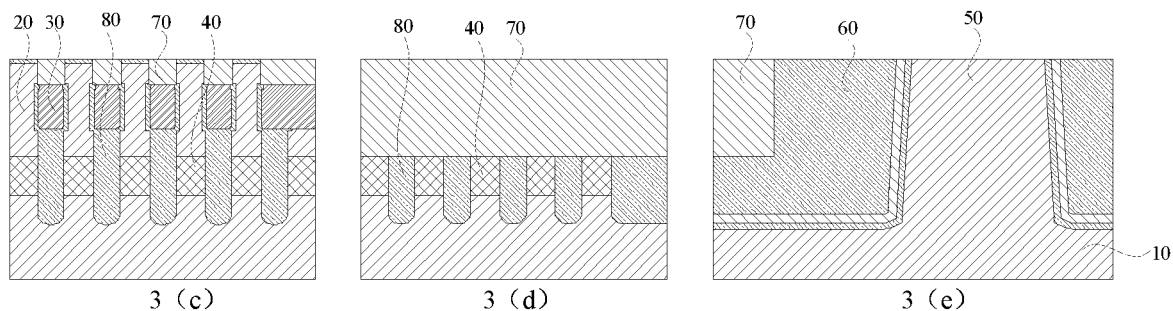

Referring to FIG. 2 and FIG. 3, a base 10 provides a support, for supporting a film layer thereon. The base 10 may be a semiconductor base. For example, the base 10 may be a silicon base, a germanium base, a silicon carbide (SiC) base, a silicon-germanium (SiGe) base, a germanium on insulator (GOI) base, a silicon on insulator (SOI) base, or the like.

The base 10 includes a first region 11 and a second region 12 connected to the first region 11. That the first region 11 is connected to the second region 12 may be understood as that the first region 11 and the second region 12 are arranged side by side in a particular direction; or may be understood as that the second region 12 is provided around the first region 11. For a structure thereof, refer to FIG. 2. To clearly know positions of the first region 11 and the second region 12, a region in a first dashed box close to an active pillar 20 in FIG. 2 is referred to as the first region 11, and a region between the first dashed box and a second dashed box is referred to as the second region 12.

In an example, the first region 11 may be an array region, used to form a transistor, a capacitor, a conductive plug, and the like. The second region 12 may be a peripheral circuit region, used to form a logic transistor and an interconnect layer, to connect a semiconductor device located in the array region and a control circuit.

Referring to FIG. 3, the base 10 located in the first region 11 may include a plurality of active pillars 20 arranged at intervals, and the active pillars 20 extend along a direction perpendicular to the base 10. The base 10 located in the second region 12 includes a plurality of active regions 50 and shallow trench isolation (STI) structures 60 used to isolate the active regions 50. The STI structure 60 may include a laminated "ONO" structure, where "O" is a silicon oxide layer, and "N" is a silicon nitride layer, that is, the STI structure 60 includes a silicon oxide layer, a silicon nitride layer, and a silicon oxide layer that are laminated.

For example, a process of forming the active pillar 20 may be as follows: The base located in the first region 11 is patterned to form a plurality of first trenches (not shown in the figure) and a plurality of second trenches (not shown in the figure) in the base 10, where the plurality of first trenches are provided at intervals along the second direction, and each of the first trenches extends along the first direction. The plurality of second trenches are provided at intervals along the first direction, and each of the first trenches extends along the second direction. The plurality of first trenches and the plurality of second trenches separate the base into a plurality of silicon pillars provided at intervals.

After the formation of the silicon pillar, plasma doping may be performed on the silicon pillar, to form a first doped region and a second doped region at the top and the bottom of the silicon pillar, respectively, such that each doped silicon pillar forms an active pillar 20.

A depth of the first trench is less than that of the second trench, such that bottoms of all active pillars located in the same second direction are connected to facilitate subsequent formation of BLs 40 in a region where the bottoms of the active pillars located in the same second direction are connected.

For example, silication treatment is performed on the base 10 exposed in the second trench to form BLs 40 in the base 10 between adjacent second trenches. The BLs 40 extend along a second direction Y, and are connected to the first doped regions or the second doped regions of the active pillars 20 located in the same second direction. For example, cobalt is injected into the second trench through an ion implantation process, such that the cobalt reacts with silicon in the base 10 under certain conditions to form a cobalt silicide layer, and the cobalt silicide layer constitutes the BL 40.

In this embodiment, the bottoms of all the active pillars 20 located in the same second direction are connected, such that the BLs 40 can be connected to the active pillars 20 located in the same second direction, thus allowing the plurality of active pillars 20 located in the same second direction to have a same voltage, thereby ensuring critical voltage stability of the semiconductor structure and reducing a floating body effect of the semiconductor structure.

Step S200: Form a first dielectric layer on the base, where the first dielectric layer covers the plurality of active pillars.

Figure 4:
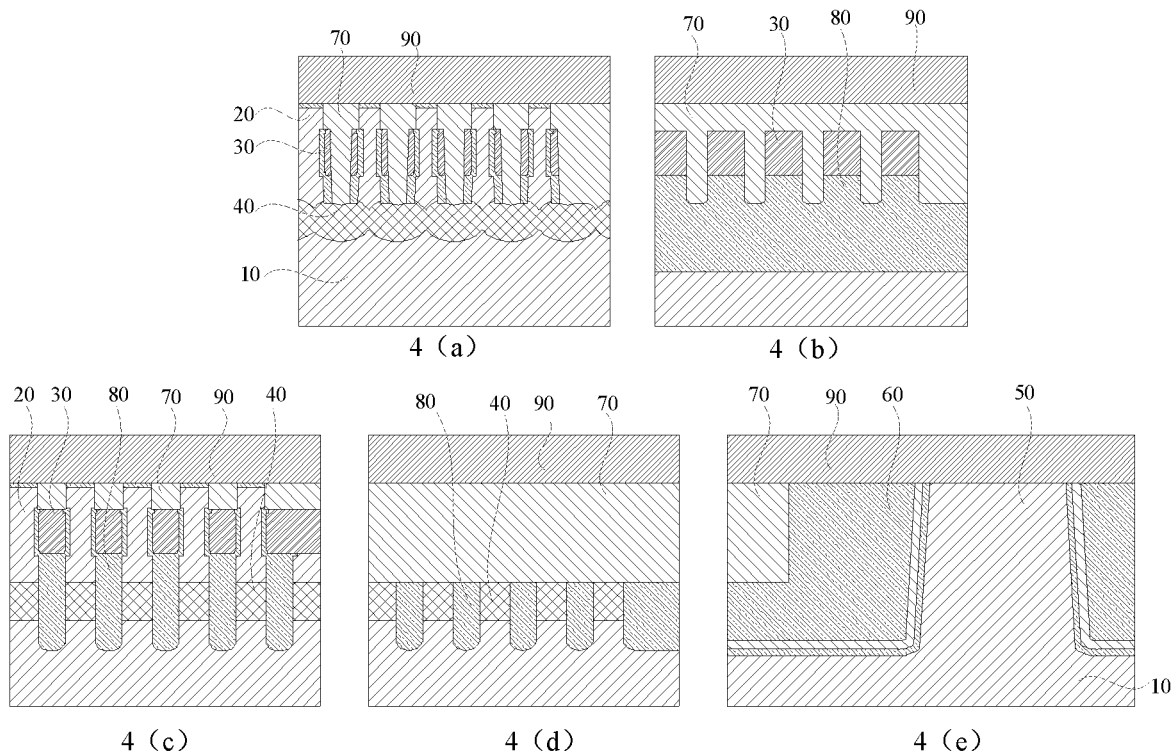
FIG. 4 is a cross-sectional view of a method of manufacturing a semiconductor structure in each of directions A-A, B-B, C-C, D-D, and E-E after formation of a first dielectric layer according to an embodiment of the present disclosure.

Referring to FIG. 4, a first dielectric layer 90 is formed on the base 10 through a chemical vapor deposition (CVD) process, a physical vapor deposition (PVD) process, an atomic layer deposition (ALD) process, or the like. The first dielectric layer 90 covers the plurality of active pillars 20 and an insulating layer 70. A material of the first dielectric layer includes silicon oxide, but is not limited thereto.

Step S300: Form a first mask layer with a first mask pattern on the first dielectric layer, where the first mask pattern is used to expose all active pillars located in a same second direction.

In this embodiment, the first mask pattern is formed through a self-aligned double-patterning (SADP) process, to ensure that there is no problem of inaccurate alignment during the formation of the first mask pattern, thereby improving accuracy of forming the first mask pattern.

Figure 5:
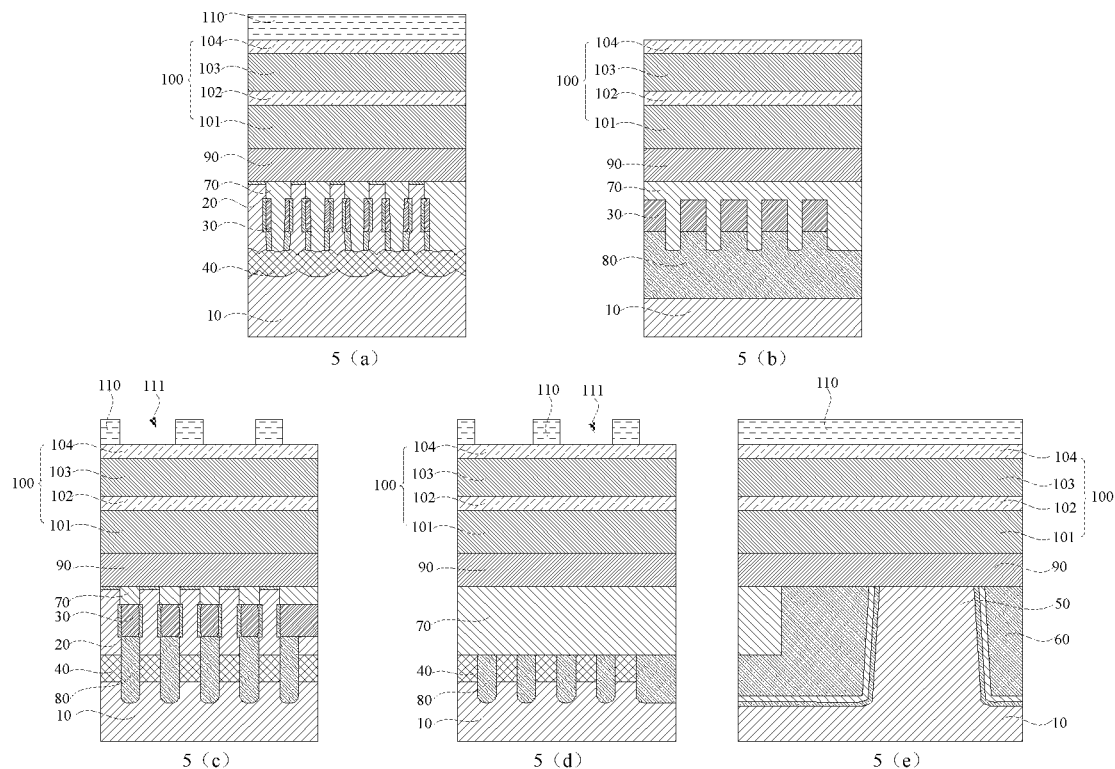
FIG. 5 is a cross-sectional view of a method of manufacturing a semiconductor structure in each of directions A-A, B-B, C-C, D-D, and E-E after formation of a first mask layer according to an embodiment of the present disclosure.

For example, referring to FIG. 5, a first mask layer 100 and a first photoresist layer 110 that are laminated are formed on the first dielectric layer 90. The first mask layer 100 is provided on a surface of the first dielectric layer 90 facing away from the base 10.

The first photoresist layer 110 is patterned, and part of the first photoresist layer 110 is removed through exposure, development, or etching to form a first opening region 111 on the first photoresist layer 110. The first opening region 111 extends along the second direction.

It should be noted that, in this embodiment, the first mask layer 100 may be a single film layer or may be a laminated structure. For example, the first mask layer 100 includes a first hard mask layer 101, a second hard mask layer 102, a third hard mask layer 103, and a fourth hard mask layer 104 that are laminated. The first hard mask layer 101 is provided on the first dielectric layer 90. In this way, accuracy of a pattern transfer process can be increased, thereby improving a yield of the semiconductor structure.

A material of the first hard mask layer 101 may be the same as that of the third hard mask layer 103. For example, the first hard mask layer 101 may be a spin on hard mask (SOH). A material of the second hard mask layer 102 may be the same as that of the fourth hard mask layer 104. For example, the material of the second hard mask layer 102 includes an amorphous carbon layer (ACL). In this way, difficulty of manufacturing the first mask layer 100 can be reduced.

Figure 6:
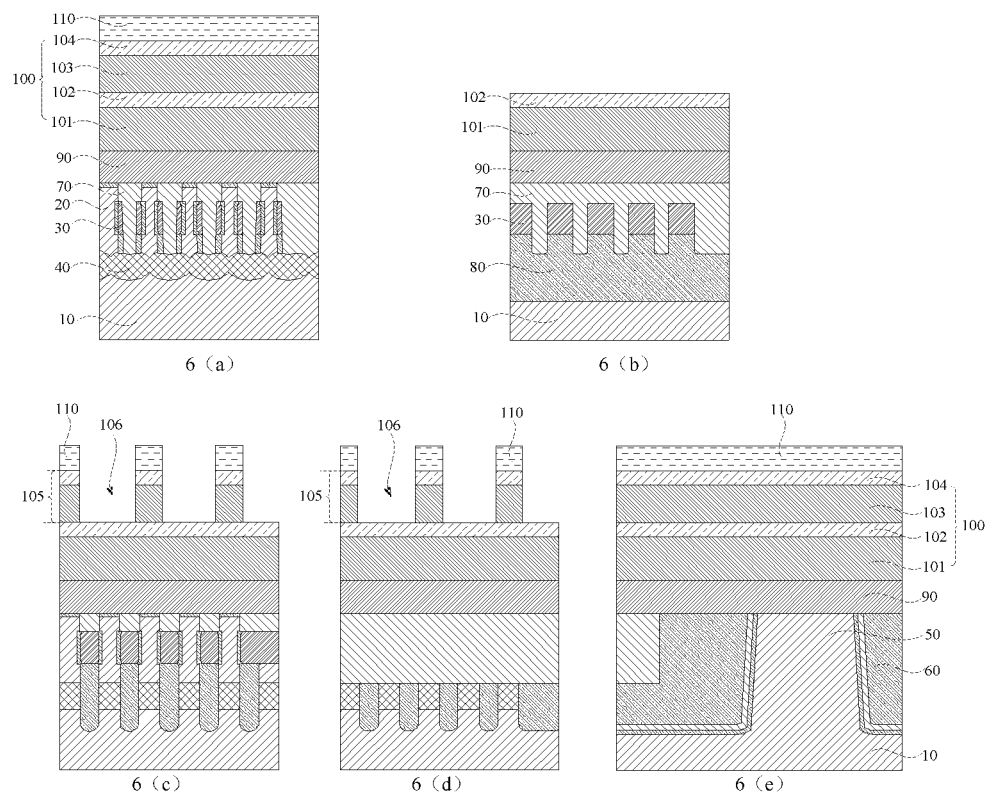
FIG. 6 is a cross-sectional view of a method of manufacturing a semiconductor structure in each of directions A-A, B-B, C-C, D-D, and E-E after formation of a first mask strip according to an embodiment of the present disclosure.

Referring to FIG. 6, a partial thickness of the first mask layer 100 exposed the first opening region 111 is removed by using the first photoresist layer 110 as a mask, to form a plurality of first mask strips 105 provided at intervals along the first direction in the first mask layer 100. Each of the first mask strips 105 extends along the second direction, and a first mask opening 106 is formed between two adjacent first mask strips 105. For example, when the first mask layer 100 is a laminated structure, referring to FIG. 6, the third hard mask layer 103 and the fourth hard mask layer 104 exposed in the first opening region 111 are removed by using an etching gas or an etching solution. The retained third hard mask layer 103 and fourth hard mask layer 104 constitute a plurality of first mask strips 105, and a first mask opening 106 is formed between adjacent first mask strips 105.

For ease of description of a position of the first mask strip 105, the first direction may be understood as a row direction, and the second direction may be understood as a column direction. Two of the first mask strips 105 are used as an example, and a positional relationship of the two first mask strips 105 and a first mask opening 106 therebetween is described.

In three adjacent columns of active pillars 20, orthographic projection of one of the first mask strips 105 on the base 10 covers a first column of active pillars 20, and orthographic projection of the other one of the first mask strips 105 on the base 10 covers a third column of active pillars 20. In other words, the orthographic projection of the first mask openings 106 on the base 10 covers a region between the first column of active pillars 20 and a second column of active pillars 20, the second column of active pillars 20, and a region between the second column of active pillars 20 and the third column of active pillars 20.

Figure 7:
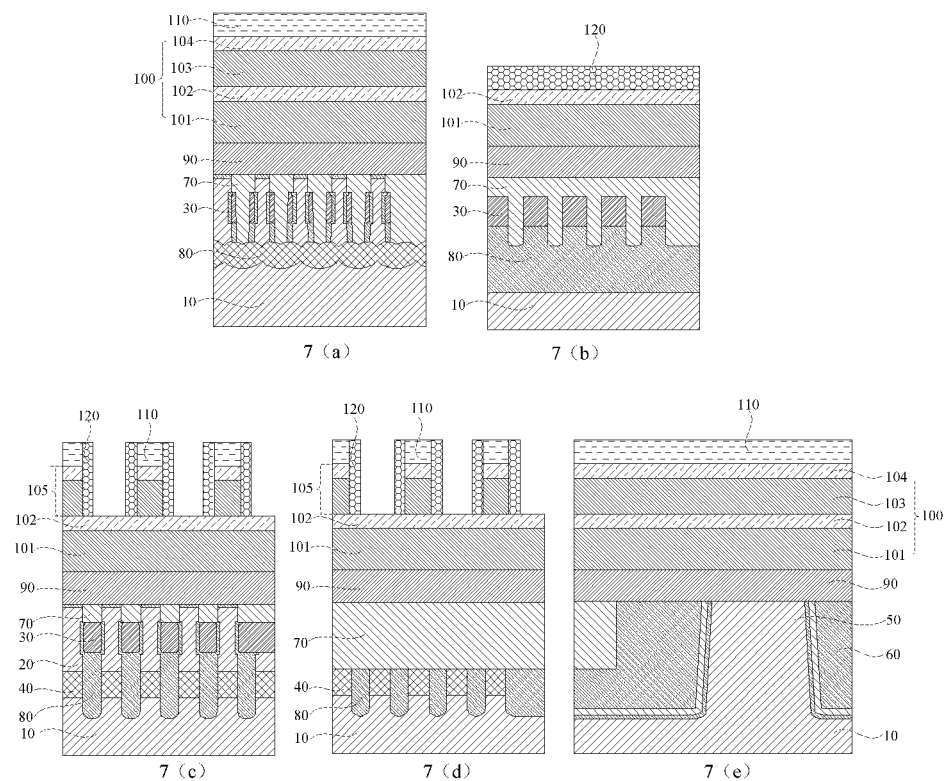
FIG. 7 is a cross-sectional view of a method of manufacturing a semiconductor structure in each of directions A-A, B-B, C-C, D-D, and E-E after formation of a second dielectric layer according to an embodiment of the present disclosure.

Referring to FIG. 7, a second dielectric layer 120 is formed on a circumferential sidewall of the first mask strip 105 and a bottom wall of the first mask opening 106 through a deposition process. A material of the second dielectric layer 120 includes silicon oxide, but is not limited thereto.

Figure 8:
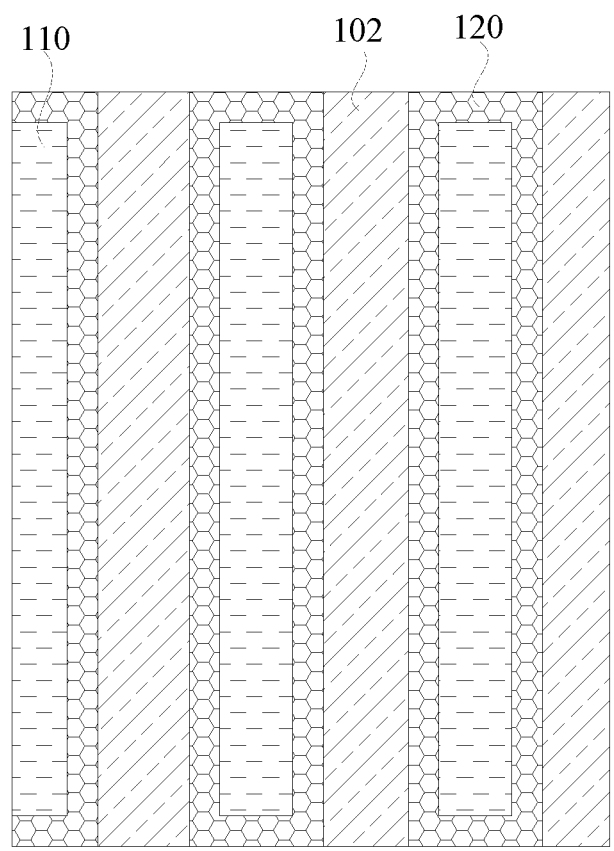
FIG. 8 is a top view of a method of manufacturing a semiconductor structure after formation of a second dielectric layer according to an embodiment of the present disclosure.
Figure 9:
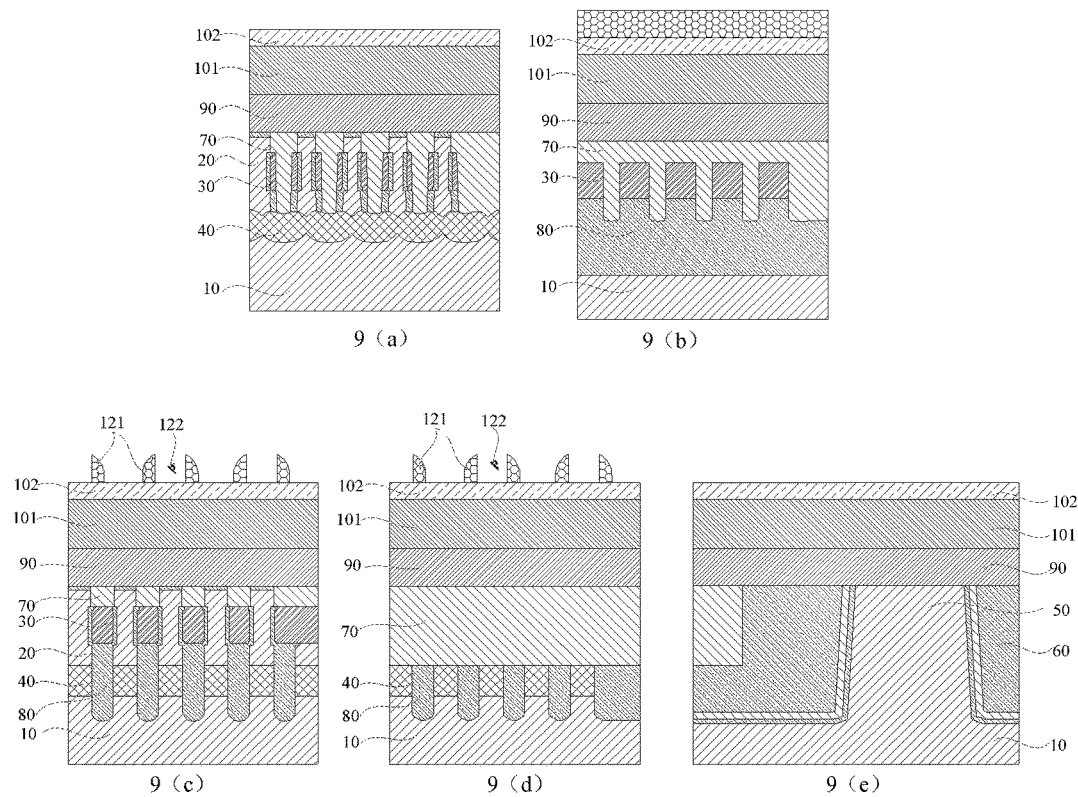
FIG. 9 is a cross-sectional view of a method of manufacturing a semiconductor structure in each of directions A-A, B-B, C-C, D-D, and E-E after formation of a first mask pattern according to an embodiment of the present disclosure.

Referring to FIG. 8 and FIG. 9, the first mask strip 105 and the first photoresist layer 110 are removed by using the second dielectric layer 120 as a mask to form a first mask pattern in the first mask layer 100. The first mask pattern includes a plurality of first annular bumps 121 and a first opening 122 located between adjacent ones of the first annular bumps 121. A region enclosed by an inner surface of the first annular bump 121 and the first opening 122 are used to expose all active pillars 20 located in the same second direction. In other words, the region enclosed by the inner surface of the first annular bump 121 may expose a same column of active pillars 20, and the first opening 122 is used to expose the same column of active pillars 20. In this way, a requirement on a lithography process can be reduced, and advantages of low costs and relatively simple process integration can be provided.

Step S400: Form a second mask layer with a second mask pattern on the first mask layer, where the second mask pattern is used to expose all active pillars located in a same first direction.

In this embodiment, the second mask pattern is formed through an SADP process, to ensure that there is no problem of inaccurate alignment during the formation of the second mask pattern, thereby improving accuracy of forming the second mask pattern.

Figure 10:
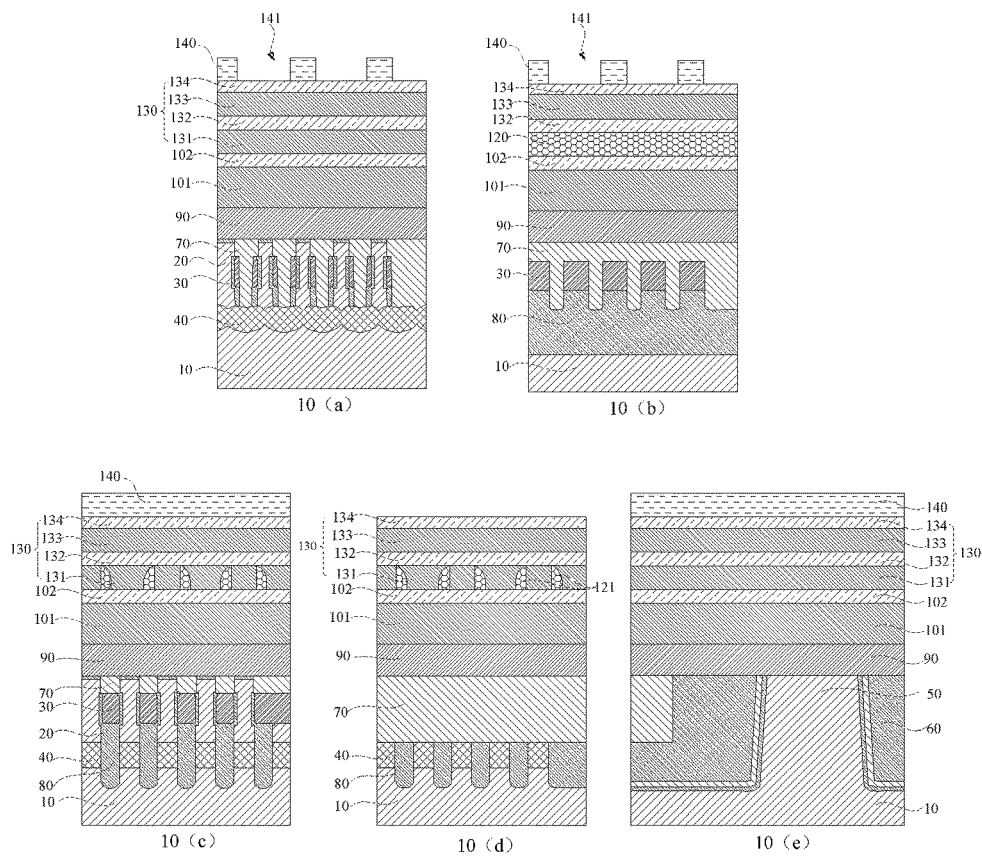
FIG. 10 is a cross-sectional view of a method of manufacturing a semiconductor structure in each of directions A-A, B-B, C-C, D-D, and E-E after formation of a second mask layer according to an embodiment of the present disclosure.

For example, referring to FIG. 10, a second mask layer 130 is formed on the retained first mask layer 100, and the second mask layer 130 covers the first mask pattern.

The second mask layer 130 may be a single film layer or may be a laminated structure. For example, the second mask layer 130 includes a fifth hard mask layer 131, a sixth hard mask layer 132, a seventh hard mask layer 133, and an eighth hard mask layer 134 that are laminated. The fifth hard mask layer 131 is provided on the first mask layer 100. In this way, accuracy of a pattern transfer process can be increased, thereby improving a yield of the semiconductor structure.

A material of the fifth hard mask layer 131 may be the same as that of the sixth hard mask layer 132. For example, the fifth hard mask layer 131 may be an SOH. The material of the fifth hard mask layer 131 may be the same as that of the eighth hard mask layer 134. For example, the material of the fifth hard mask layer 131 includes an ACL. In this way, difficulty of manufacturing the second mask layer 130 can be reduced.

Subsequently, still referring to FIG. 10, a second photoresist layer 140 is formed on the second mask layer 130, and the second photoresist layer 140 is patterned to form a second opening region 141 extending along the first direction in the second photoresist layer 140.

Figure 11:
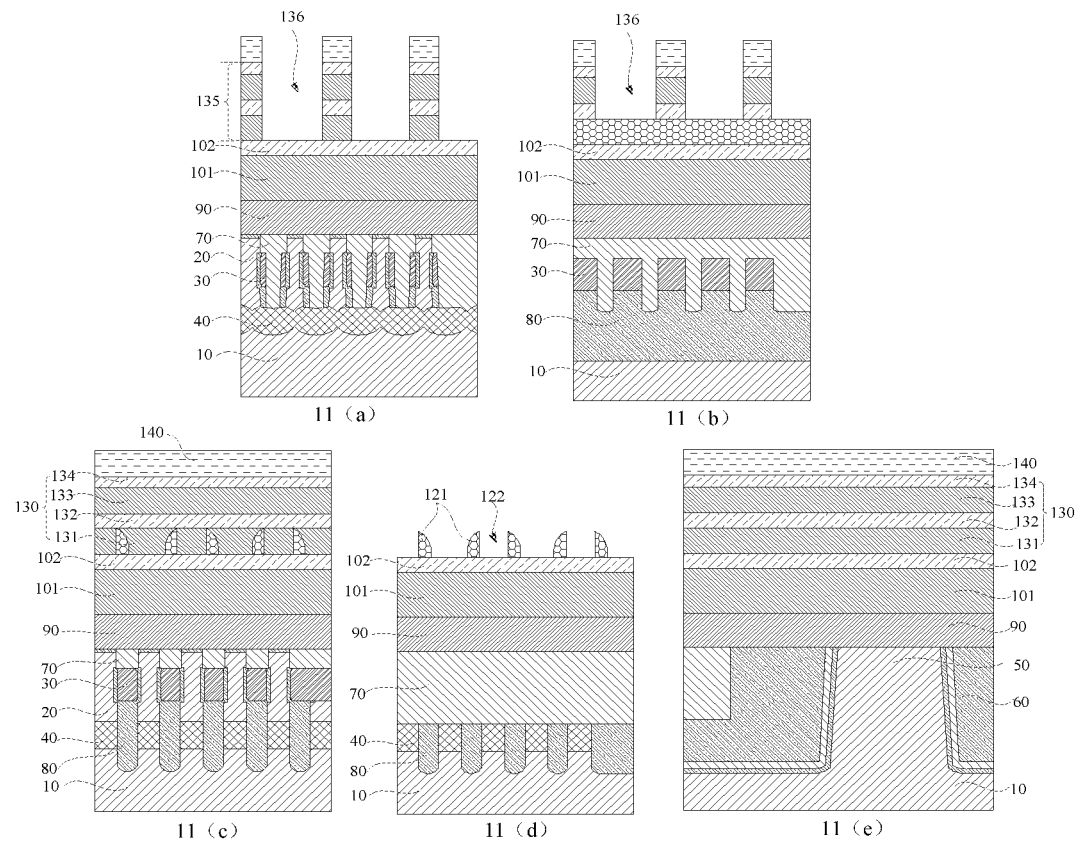
FIG. 11 is a cross-sectional view of a method of manufacturing a semiconductor structure in each of directions A-A, B-B, C-C, D-D, and E-E after formation of a second initial mask strip according to an embodiment of the present disclosure.

Subsequently, referring to FIG. 11, the second mask layer 130 exposed in the second opening region 141 is removed by etching by using the patterned second photoresist layer 140 as a mask to form, in the second mask layer 130, a plurality of second initial mask strips 135 provided at intervals along the second direction, and a second mask opening 136 is formed between two adjacent second initial mask strips 135. Each of the second initial mask strips 135 extends along the first direction, and the second mask opening 136 exposes two adjacent rows of active pillars 20.

Figure 12:
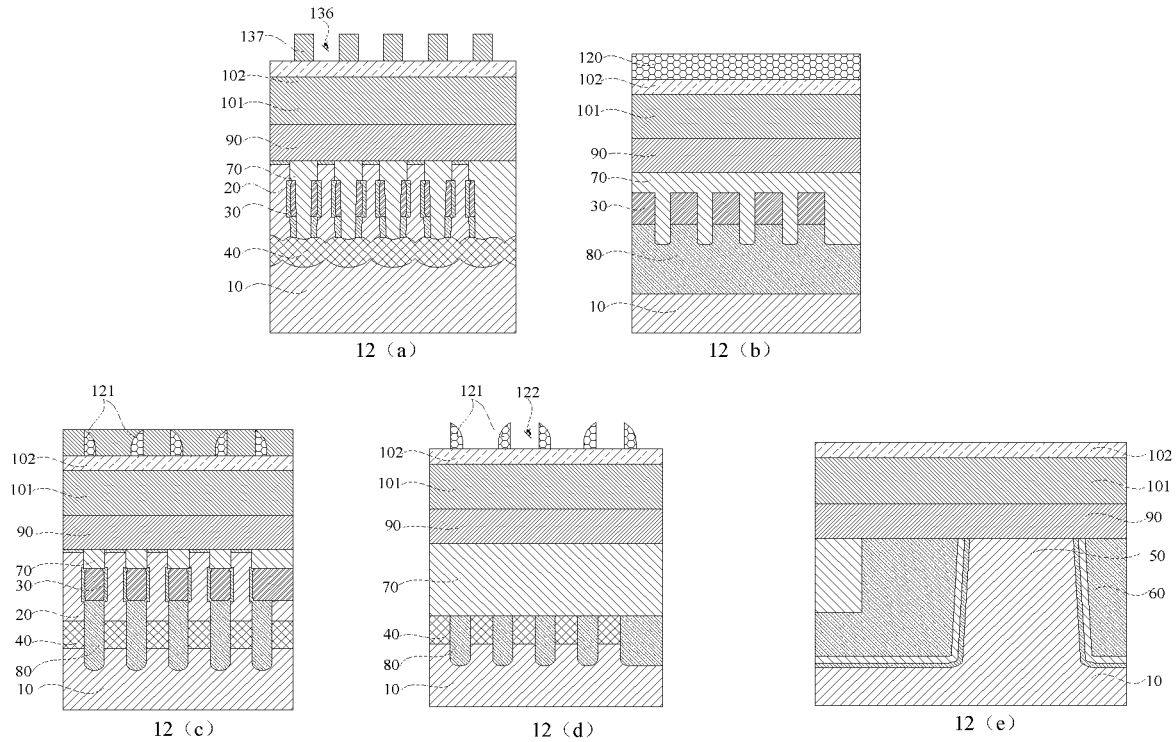
FIG. 12 is a cross-sectional view of a method of manufacturing a semiconductor structure in each of directions A-A, B-B, C-C, D-D, and E-E after formation of a second mask strip according to an embodiment of the present disclosure.

Referring to FIG. 12, a partial thickness of the second initial mask strip 135 and the second photoresist layer 140 are removed, and the retained second initial mask strip 135 constitutes a second mask strip 137.

For example, the retained sixth hard mask layer 132, seventh hard mask layer 133, and eighth hard mask layer 134 are removed, and the retained fifth hard mask layer 131 constitutes the second mask strip 137. In this way, a height of the second mask strip 137 is reduced, thereby reducing difficulty of subsequently forming a third dielectric layer.

For ease of description of a position of the second mask strip 137, the first direction may be understood as a row direction, and the second direction may be understood as a column direction. Two of the second mask strips 137 are used as an example, and a positional relationship of the two second mask strips 137 and a second mask opening 136 therebetween is described.

In three adjacent rows of active pillars 20, orthographic projection of one of the second mask strips 137 on the base 10 covers a first row of active pillars 20, and orthographic projection of the other one of the second mask strips 137 on the base 10 covers a third row of active pillars 20. In other words, the second mask opening 136 exposes a region between the first row of active pillars 20 and a second row of active pillars 20, the second row of active pillars 20, and a region between the second row of active pillars 20 and the third row of active pillars 20.

Figure 13:
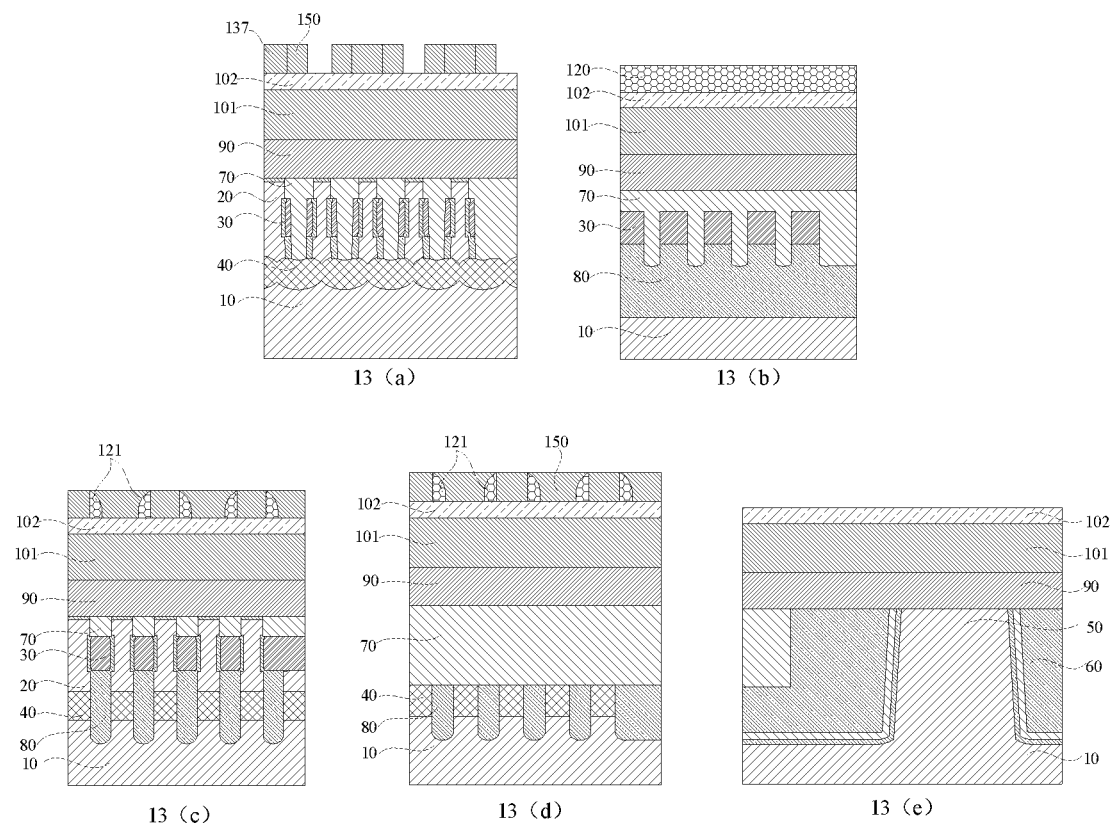
FIG. 13 is a cross-sectional view of a method of manufacturing a semiconductor structure in each of directions A-A, B-B, C-C, D-D, and E-E after formation of a third dielectric layer according to an embodiment of the present disclosure.

Referring to FIG. 13, a third dielectric layer 150 is formed on a circumferential sidewall of the second mask strip 137 and a bottom wall of the second mask opening 136 through a deposition process.

Figure 14:
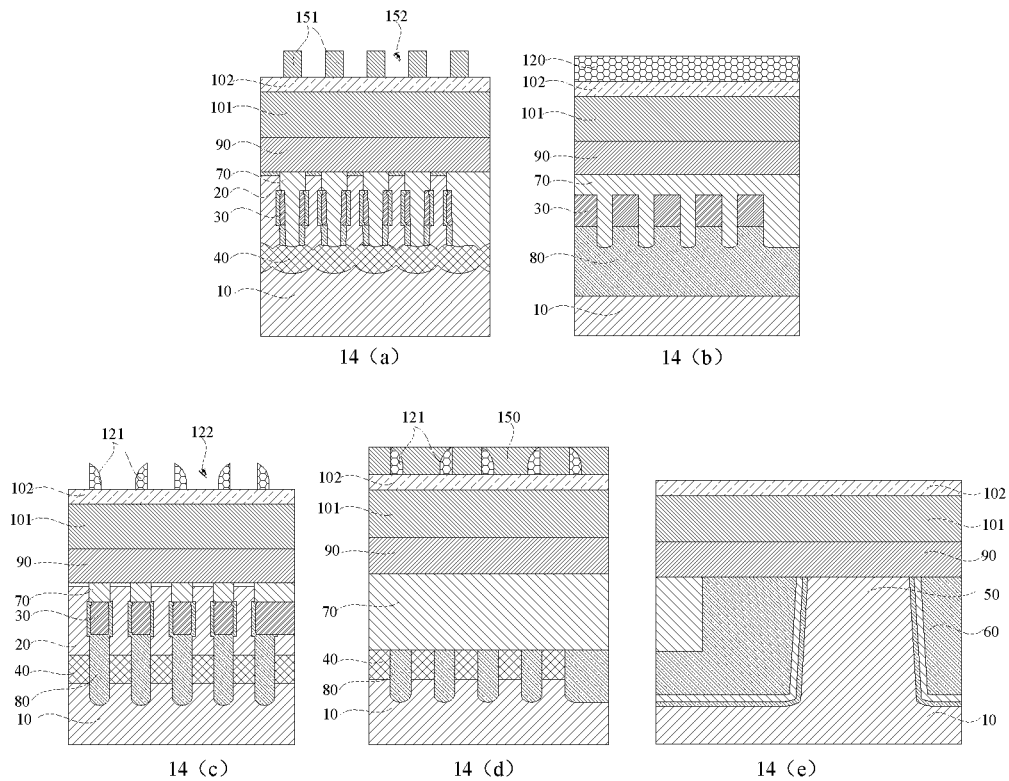
FIG. 14 is a cross-sectional view of a method of manufacturing a semiconductor structure in each of directions A-A, B-B, C-C, D-D, and E-E after formation of a second mask pattern according to an embodiment of the present disclosure.
Figure 15:
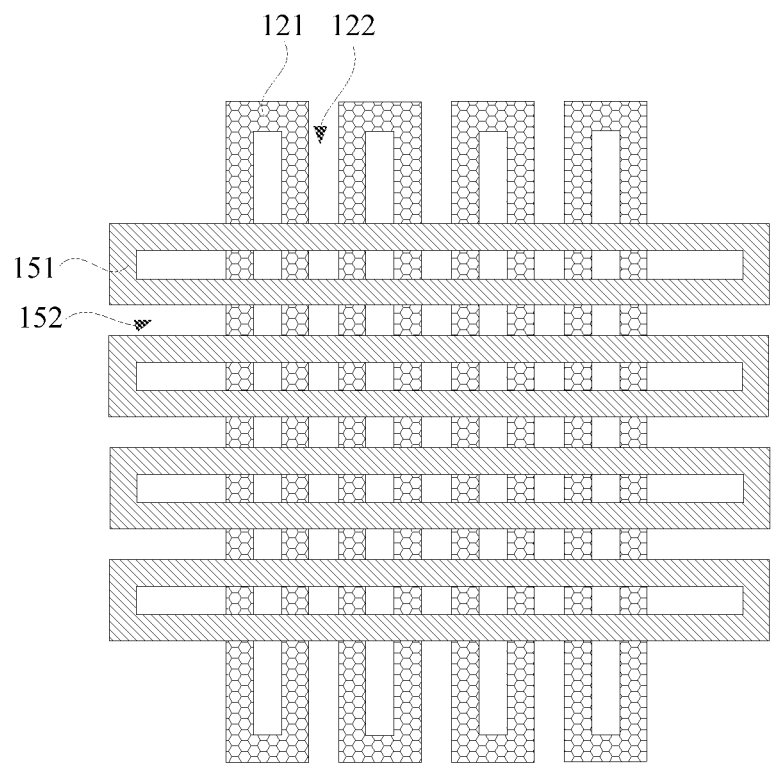
FIG. 15 is a schematic diagram after formation of a first mask pattern and a second mask pattern according to an embodiment of the present disclosure.

Subsequently, referring to FIG. 14 and FIG. 15, the second mask strip is removed by using an etching solution or an etching gas, such that the third dielectric layer 150 originally located on the circumferential sidewall of the second mask strip constitutes a second annular bump 151. In addition, a second opening 152 is caused to be formed between adjacent second annular bumps 151.

A region enclosed by an inner surface of the second annular bump 151 and the second opening 152 are used to expose all active pillars 20 located in the same first direction. In other words, the region enclosed by the inner surface of the second annular bump 151 may expose a same row of active pillars 20, and the second opening 152 is used to expose the same row of active pillars 20. In this way, advantages of low costs and relatively simple process integration are provided.

Step S500: Form a third mask layer with a third mask opening, where the third mask opening is used to expose the first region.

Figure 16:
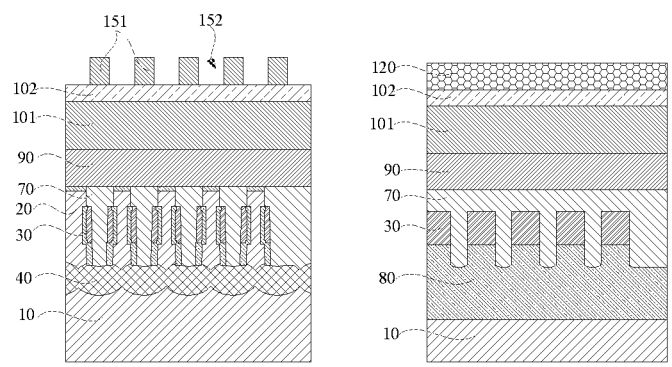
FIG. 16 is a cross-sectional view of a method of manufacturing a semiconductor structure in each of directions A-A, B-B, C-C, D-D, and E-E after formation of a third mask layer according to an embodiment of the present disclosure.
Figure 16:
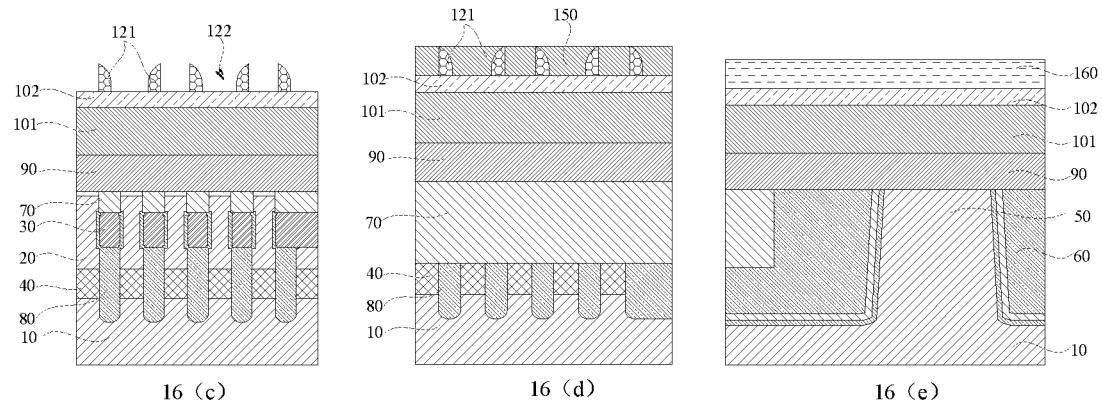
Figure 17:
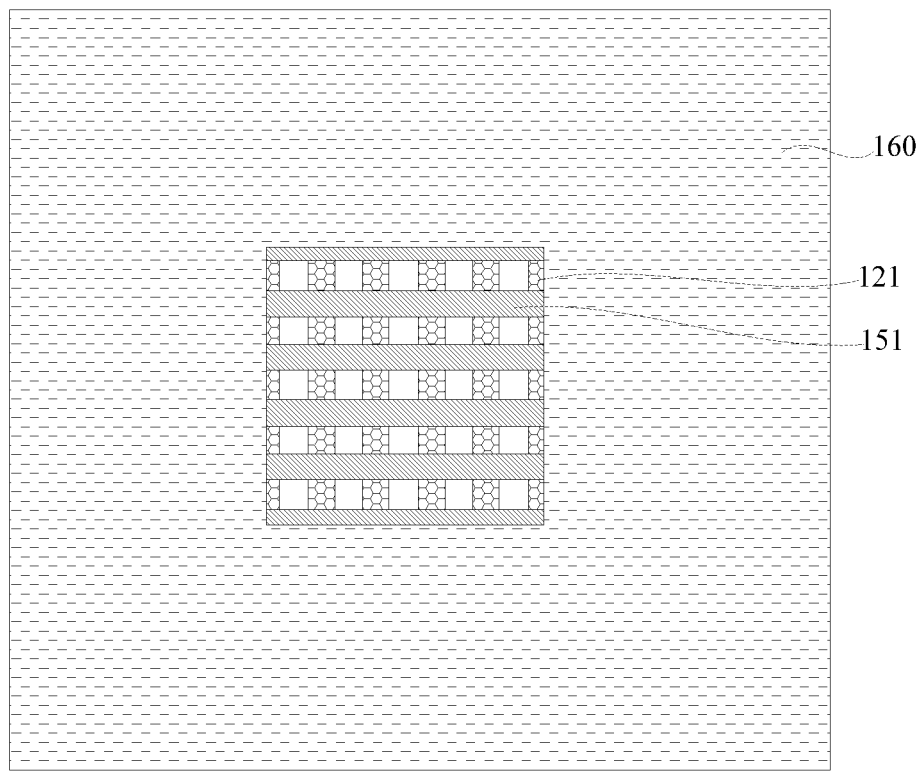
FIG. 17 is a top view of a method of manufacturing a semiconductor structure after formation of a third mask layer according to an embodiment of the present disclosure.

Referring to FIG. 16 and FIG. 17, a third mask layer 160 is used to cover the second region 12 (for example, a peripheral circuit region), and the third mask opening exposes the first region 11 (for example, an array region). The third mask layer 160 may be a photoresist layer.

Step S600: Remove part of the first dielectric layer by using the first mask layer, the second mask layer, and the third mask layer as a mask, to form a plurality of contact holes distributed in an array in the first dielectric layer, where each of the contact holes exposes a top surface of one of the active pillars.

Figure 18:
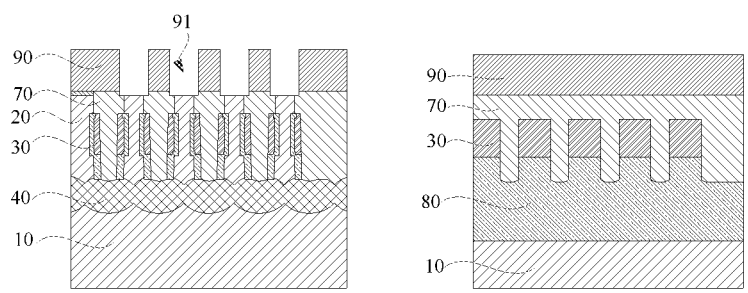
FIG. 18 is a cross-sectional view of a method of manufacturing a semiconductor structure in each of directions A-A, B-B, C-C, D-D, and E-E after formation of a contact hole according to an embodiment of the present disclosure.
Figure 18:
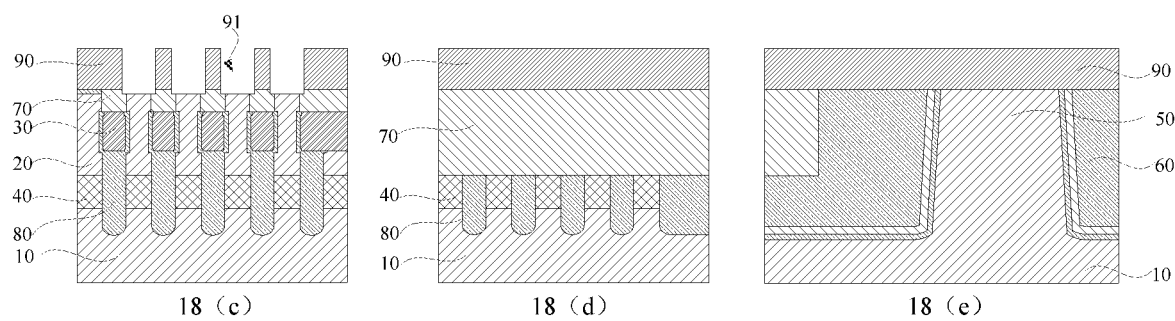

Referring to FIG. 18, the first dielectric layer 90 exposed in etched holes defined by the first mask pattern and the second mask pattern is removed through dry etching or wet etching by using the first mask layer 100, the second mask layer 130, and the third mask layer 160 as masks, to form a plurality of contact holes 91 in the first dielectric layer 90. Each of the contact holes 91 exposes a top surface of one of the active pillars 20. In this way, in this embodiment, positions at which contact holes subsequently need to be formed by etching are defined through three times of mask processes. This embodiment reduces a quantity of times of masking process and simplifies a manufacturing process of the contact holes, thereby reducing manufacturing costs of the semiconductor structure.

It should be noted that, after the formation of the contact holes 91, the third mask layer may be removed by using a cleaning solution to facilitate manufacturing of a subsequent process.

Figure 19:
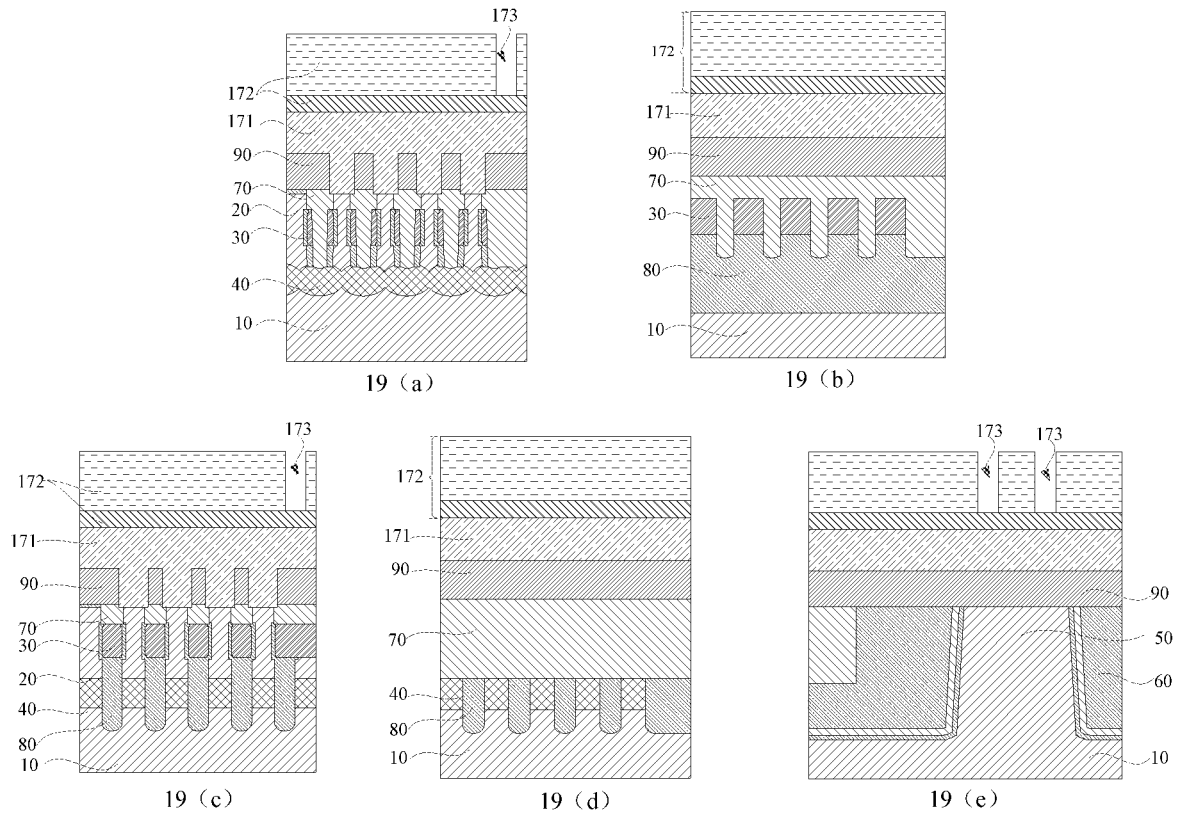
FIG. 19 is a cross-sectional view of a method of manufacturing a semiconductor structure in each of directions A-A, B-B, C-C, D-D, and E-E after formation of a fourth mask layer according to an embodiment of the present disclosure.
Figure 20:
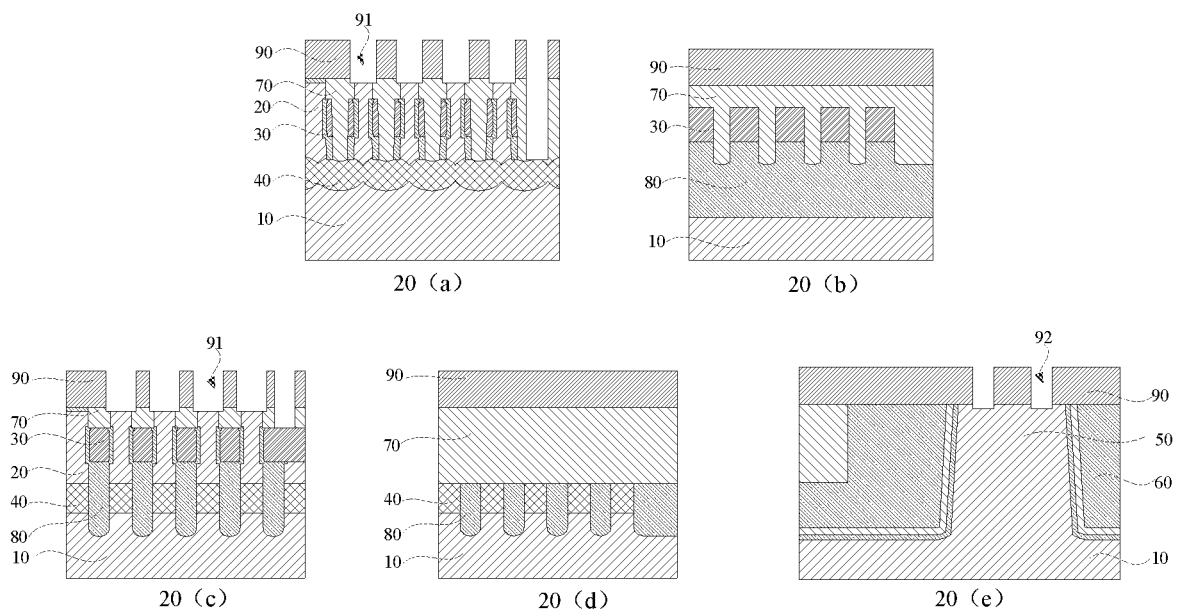
FIG. 20 is a cross-sectional view of a method of manufacturing a semiconductor structure in each of directions A-A, B-B, C-C, D-D, and E-E after formation of a connecting hole according to an embodiment of the present disclosure.

In some embodiments, after the step of using the first mask layer, the second mask layer, and the third mask layer as masks, the method of manufacturing a semiconductor structure further includes:

referring to FIG. 19, forming a sacrificial layer 171 in the contact hole 91 by using a deposition process, where the sacrificial layer 171 fills up the contact hole 91, extends outside the contact hole 91, and covers a top surface of the first dielectric layer 90; and referring to FIG. 20, removing part of the sacrificial layer 171 and part of the first dielectric layer 90 located in the second region to form a connecting hole 92 in the first dielectric layer 90, where the connecting hole 92 exposes an active region 50 located in the second region.

For example, referring to FIG. 19, a fourth mask layer 172 is formed on the sacrificial layer 171, and the fourth mask layer 172 is patterned to form an etched hole 173 in the fourth mask layer 172, where the etched hole 173 is located in the second region.

Still referring to FIG. 20, part of the first dielectric layer 90 is removed by using the patterned fourth mask layer 172 as a mask, to form a connecting hole 92 in the first dielectric layer 90, where the connecting hole 92 exposes an active region 50 located in the second region. There may be one or more connecting holes 92. When there are a plurality of connecting holes 92, the plurality of connecting holes 92 may be provided at intervals in the first dielectric layer 90, and each of the connecting holes 92 can expose the active region 50.

Subsequently, the sacrificial layer 171 and the fourth mask layer 172 are removed.

In this embodiment, the provision of the sacrificial layer can ensure that the connecting holes can be formed and can avoid damage to the contact holes, thereby improving performance of the semiconductor structure.

In a possible implementation, a hole bottom of the contact hole 91 is located in the active pillar 20, and a hole bottom of the connecting hole 92 is located in the active region 50. In this way, a contact area between a subsequently formed capacitive contact structure and the active pillar 20 can be increased, and a contact area between a subsequently formed conductive structure and the active region 50 can be increased, thereby improving timeliness of signal transmission and improving electrical performance of the semiconductor structure.

Figure 21:
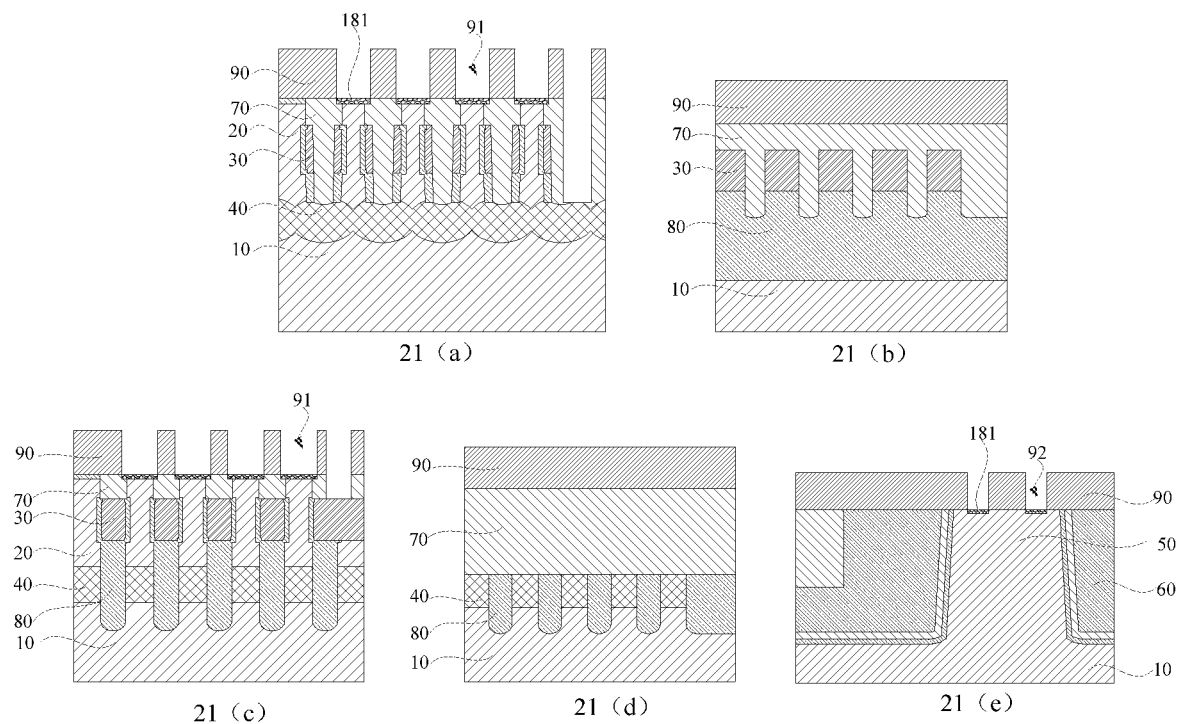
FIG. 21 is a cross-sectional view of a method of manufacturing a semiconductor structure in each of directions A-A, B-B, C-C, D-D, and E-E after formation of a silicide layer according to an embodiment of the present disclosure.

In some embodiments, after the step of removing the sacrificial layer and the fourth mask layer, the method of manufacturing a semiconductor structure further includes:

referring to FIG. 21, forming a capacitive contact structure 180 in the contact hole 91, and forming a conductive structure 190 in the connecting hole 92, where the capacitive contact structure 180 and the conductive structure 190 each include a silicide layer 181 and a conductive plug 182 provided on the silicide layer 181. For example, still referring to 21, the silicide layer 181 is formed in each of the contact hole 91 and the connecting hole 92 by using a deposition process. A top surface of the silicide layer 181 is lower than the top surface of the first dielectric layer 90. For example, the top surface of the silicide layer 181 is flush with a top surface of the base 10, or may be higher than the top surface of the base 10.

The silicide layer 181 may be directly formed through a deposition process or may be formed through another process. For example, a metallic material is deposited in the contact hole 91 and the connecting hole 92. The metallic material may include Co.

The metallic material is treated, for example, the metallic material is annealed, such that the metallic material reacts with the base 10 exposed in each of the contact hole 91 and the connecting hole 92 to form the silicide layer 181.

Figure 22:
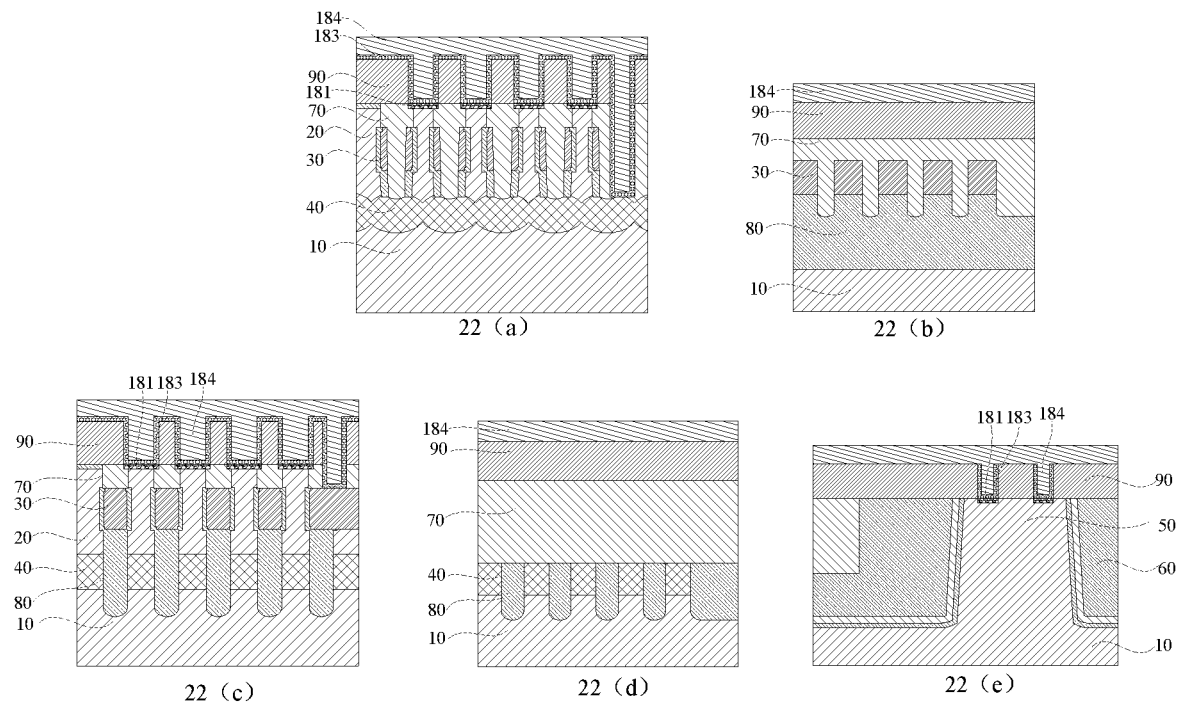
FIG. 22 is a cross-sectional view of a method of manufacturing a semiconductor structure in each of directions A-A, B-B, C-C, D-D, and E-E after formation of a barrier layer and a conductive layer according to an embodiment of the present disclosure.

Referring to FIG. 22, a barrier layer 183 is formed on the silicide layer 181, where the barrier layer 183 extends outside the contact hole 91 and the connecting hole 92 and covers the top surface of the first dielectric layer 90. A material of the barrier layer 183 includes titanium nitride. The titanium nitride can prevent subsequent infiltration between a conductive material in the conductive plug 182 and the base. In addition, the titanium nitride has electrical conductivity, thereby ensuring performance of the semiconductor device.

Still referring to FIG. 22, a conductive layer 184 is formed on the barrier layer 183, where the conductive layer 184 fills up a region enclosed by the barrier layer 183. A material of the conductive layer 184 includes tungsten, but is not limited thereto.

Figure 23:
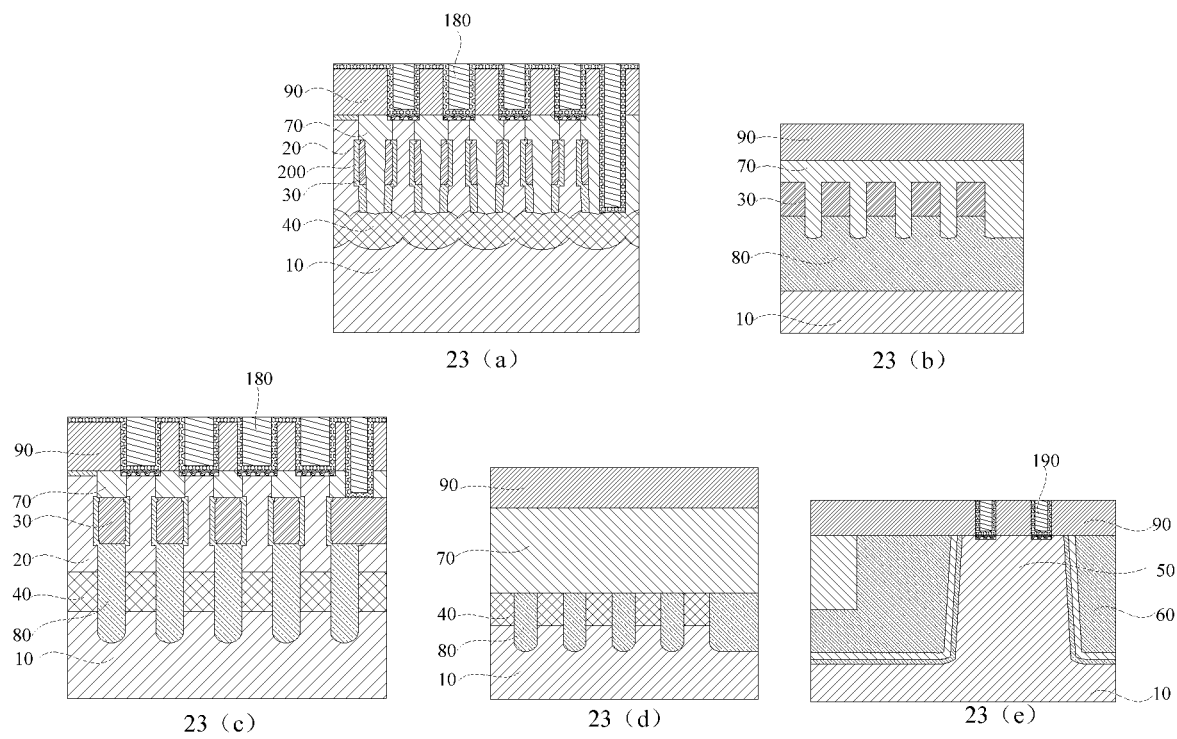
FIG. 23 is a cross-sectional view of a method of manufacturing a semiconductor structure in each of directions A-A, B-B, C-C, D-D, and E-E after formation of a capacitive contact structure and a conductive structure according to an embodiment of the present disclosure.

Referring to FIG. 23, the conductive layer 184 and the barrier layer 183 located on the first dielectric layer 90 are removed through chemical mechanical polishing (CMP), the barrier layer 183 and the conductive layer 184 that are retained in the contact hole 91 constitute the conductive plug 182 of the capacitive contact structure 180, and the barrier layer 183 and the conductive layer 184 that are retained in the connecting hole 92 constitute the conductive plug 182 of the conductive structure 190.

In this embodiment, the capacitive contact structure 180 may be formed in the contact hole 91 and the conductive structure 190 may be formed in the connecting hole 92 simultaneously. In this way, a two-step formation process can be prevented from being used to form the capacitive contact structure 180 and the conductive structure 190, such that a manufacturing process of the capacitive contact structure and the conductive structure can be simplified, thereby reducing production costs of the semiconductor structure.

An embodiment of the present disclosure further provides a semiconductor structure. The semiconductor structure is manufactured by using the manufacturing method in the foregoing embodiment.

Referring to FIG. 23, the semiconductor structure includes a base 10, a plurality of capacitive contact structures 180, and a conductive structure 190. The base 10 includes a first region and a second region connected to the first region. A plurality of active pillars 20 are arranged at intervals in the base 10 located in the first region. An active region 50 is provided in the base located in the second region.

The plurality of capacitive contact structures 180 are in a one-to-one correspondence with the plurality of active pillars 20, and the capacitive contact structure 180 is provided on the active pillar 20.

The conductive structure 190 is provided in the active region 50 and is electrically connected to the active region 50, and the conductive structure 190 and the capacitive contact structure 180 are of a same structure.

In this embodiment, the capacitive contact structure 180 and the conductive structure 190 are of the same structure, such that a two-step formation process can be prevented from being used to form the capacitive contact structure 180 and the conductive structure 190, and a manufacturing process of the capacitive contact structure and the conductive structure can be simplified, thereby reducing production costs of the semiconductor structure.

In some embodiments, the capacitive contact structure 180 and the conductive structure 190 each include a silicide layer 181 and a conductive plug 182 provided on the silicide layer 181. The conductive plug 182 includes a barrier layer 183 and a conductive layer 184. The barrier layer 183 is provided on the silicide layer 181, and the barrier layer 183 encloses a filling region. The conductive layer 184 is provided in the filling region and fills up the filling region.

In some embodiments, the semiconductor structure further includes a dielectric layer 90. The dielectric layer 90 is provided on the base 10 and wraps around a peripheral surface of each of the capacitive contact structure 180 and the conductive structure 190. The dielectric layer 90 is used to achieve an insulating provision between the capacitive contact structure 180 and the conductive structure 190, and prevent the capacitive contact structure 180 from being electrically connected to the conductive structure 190.

In some embodiments, along a direction perpendicular to the base 10, the active pillar 20 includes a channel region and a first doped region and a second doped region respectively located on two sides of the channel region. The capacitive contact structure 180 is connected to the second doped region.

A type of doped ions in the first doped region and a type of doped ions in the second doped region are the same, for example, P-type ions or N-type ions. A type of doped ions in the channel region is different from the type of doped ions in the first doped region. In an example, when the doped ions in the first doped region are N-type ions, correspondingly, the doped ions in the channel region are P-type ions. In another example, when the doped ions in the first doped region are P-type ions, correspondingly, the doped ions in the channel region are N-type ions.

The semiconductor structure further includes a plurality of WLs 30, and each of the WLs 30 extends along a first direction and is connected to the channel region of the active pillar 20 located in the same first direction, to control communication or disconnection between the first doped region and the second doped region.

A gate oxide layer 200 is provided between the WL 30 and the active pillar 20. The gate oxide layer 200 wraps part of the active pillar 20. For example, the gate oxide layer 200 wraps the channel region of the active pillar 20. The gate oxide layer 200 can ensure normal operation of the WL 30.

The base 10 further includes a plurality of BLs 40, and the BL 40 extends along a second direction and is connected to the first doped region of the active pillar 20 located in the same second direction. The first direction intersects with the second direction. For example, the first direction and the second direction are perpendicular to each other.

In this embodiment, the bottoms of all the active pillars 20 located in the same second direction are connected, such that the BLs 40 can be connected to the active pillars 20 located in the same second direction, thus allowing the first doped region of each of the plurality of active pillars 20 located in the same second direction to have a same voltage, thereby ensuring critical voltage stability of the semiconductor structure and reducing a floating body effect of the semiconductor structure.

The base 10 is further provided with an insulating layer 70. The insulating layer 70 is used to achieve insulating provision between the WLs 30. A material of the insulating layer 70 includes silicon nitride, but is not limited thereto.

The base 10 is further provided with a BL isolation structure 80. The BL isolation structure 80 is used to achieve insulating provision between the BLs 40. A material of the BL isolation structure 80 includes silicon oxide, but is not limited thereto.

The embodiments or implementations of this specification are described in a progressive manner, and each embodiment focuses on differences from other embodiments. The same or similar parts between the embodiments may refer to each other.

In the descriptions of this specification, a description with reference to the term "one implementation", "some implementations", "an exemplary implementation", "an example", "a specific example", "some examples", or the like means that a specific feature, structure, material, or characteristic described in combination with the implementation(s) or example(s) is included in at least one implementation or example of the present disclosure.

In this specification, the schematic expression of the above terms does not necessarily refer to the same embodiment or example. Moreover, the described specific feature, structure, material or characteristic may be combined in an appropriate manner in any one or more implementations or examples.

Finally, it should be noted that the foregoing embodiments are used only to explain the technical solutions of the present disclosure, but are not intended to limit the present disclosure. Although the present disclosure has been described in detail with reference to the foregoing embodiments, those of ordinary skill in the art should understand that they can still modify the technical solutions described in the foregoing embodiments, or make equivalent substitutions on some or all technical features therein. The modifications or substitutions do not make the essence of the corresponding technical solutions deviate from the scope of the technical solutions of the embodiments of the present disclosure.

The invention claimed is:

1. A method of manufacturing a semiconductor structure, comprising:
    providing a base, wherein the base comprises a first region and a second region connected to the first region, and a plurality of active pillars are arranged at intervals in the base located in the first region;
    forming a first dielectric layer on the base, wherein the first dielectric layer covers the plurality of active pillars;
    forming a first mask layer with a first mask pattern on the first dielectric layer, wherein the first mask pattern is used to expose all active pillars located in a same second direction;
    forming a second mask layer with a second mask pattern on the first mask layer, wherein the second mask pattern is used to expose all active pillars located in a same first direction;
    forming a third mask layer with a third mask opening, wherein the third mask opening is used to expose the first region; and
    removing part of the first dielectric layer by using the first mask layer, the second mask layer, and the third mask layer as a mask, to form a plurality of contact holes distributed in an array in the first dielectric layer, wherein each of the contact holes exposes a top surface of one of the active pillars.

2. The method of manufacturing the semiconductor structure according to claim 1, wherein
    after the using the first mask layer, the second mask layer, and the third mask layer as a mask, the method of manufacturing further comprises:
    forming a sacrificial layer in the contact hole, wherein the sacrificial layer extends outside the contact hole and covers a top surface of the first dielectric layer;
    removing part of the sacrificial layer and part of the first dielectric layer located in the second region to form a connecting hole in the first dielectric layer, wherein the connecting hole exposes an active region located in the second region; and
    removing the sacrificial layer.

3. The method of manufacturing the semiconductor structure according to claim 2, wherein
    after the removing the sacrificial layer, the method of manufacturing comprises:
    forming a capacitive contact structure in the contact hole, and forming a conductive structure in the connecting hole, wherein the capacitive contact structure and the conductive structure each include a silicide layer and a conductive plug provided on the silicide layer.

4. The method of manufacturing the semiconductor structure according to claim 3, wherein
    the forming a capacitive contact structure in the contact hole comprises:
    forming the silicide layer in the contact hole and the connecting hole, wherein a top surface of the silicide layer is lower than the top surface of the first dielectric layer;
    forming a barrier layer on the silicide layer, wherein the barrier layer extends outside the contact hole and the connecting hole and covers the top surface of the first dielectric layer;
    forming a conductive layer on the barrier layer, wherein the conductive layer fills up a region enclosed by the barrier layer; and
    removing part of the conductive layer and part of the barrier layer, retaining the barrier layer and the conductive layer in the contact hole to constitute the conductive plug of the capacitive contact structure, and retaining the barrier layer and the conductive layer in the connecting hole to constitute the conductive plug of the conductive structure.

5. The method of manufacturing the semiconductor structure according to claim 4, wherein
    the forming a silicide layer in the contact hole and the connecting hole, wherein a top surface of the silicide layer is lower than the top surface of the first dielectric layer comprises:
    depositing a metallic material in the contact hole and the connecting hole; and
    treating the metallic material such that the metallic material reacts with the base exposed in each of the contact hole and the connecting hole to form the silicide layer.

6. The method of manufacturing the semiconductor structure according to claim 2, wherein
    a hole bottom of the contact hole is located in the active pillar, and a hole bottom of the connecting hole is located in the active region.

7. The method of manufacturing the semiconductor structure according to claim 2, wherein
    the removing part of the sacrificial layer and part of the first dielectric layer located in the second region comprises:
    forming a fourth mask layer on the sacrificial layer;
    patterning the fourth mask layer to form an etched hole in the fourth mask layer, wherein projection of the etched hole on the base is located in the active region; and
    etching the sacrificial layer and the first dielectric layer exposed in the etched hole.

8. A semiconductor structure, wherein
the semiconductor structure is manufactured by using the method of manufacturing the semiconductor structure according to claim 1;
and the semiconductor structure comprises:
a base, wherein the base comprises a first region and a second region connected to the first region, a plurality of active pillars are arranged at intervals in the base located in the first region, and an active region is provided in the base located in the second region;
a plurality of capacitive contact structures, wherein the plurality of capacitive contact structures are in a one-to-one correspondence with the plurality of active pillars, and the capacitive contact structure is provided on the active pillar; and
a conductive structure, wherein the conductive structure is provided in the active region and is electrically connected to the active region, and the conductive structure and the capacitive contact structure are of a same structure;
wherein the semiconductor structure further comprises a dielectric layer; and
the dielectric layer is provided on the base and wraps around a peripheral surface of each of the capacitive contact structure and the conductive structure.

9. The semiconductor structure according to claim 8, wherein
the capacitive contact structure and the conductive structure each comprise a silicide layer and a conductive plug provided on the silicide layer.

10. The semiconductor structure according to claim 9, wherein
the conductive plug comprises a barrier layer and a conductive layer;
the barrier layer is provided on the silicide layer, and the barrier layer encloses a filling region; and
the conductive layer is provided in the filling region and fills up the filling region.

11. The semiconductor structure according to claim 8, wherein
along a direction perpendicular to the base, the active pillar comprises a channel region and a first doped region and a second doped region respectively located on two sides of the channel region; and
the capacitive contact structure is connected to the second doped region.

12. The semiconductor structure according to claim 11, wherein
the semiconductor structure further comprises a plurality of word lines, and each of the word lines extends along a first direction and is connected to the channel region of the active pillar located in a same first direction.

13. The semiconductor structure according to claim 12, wherein
the base further comprises a plurality of bit lines, and the bit line extends along a second direction and is connected to the first doped region of the active pillar located in a same second direction; and the first direction intersects with the second direction.

14. The semiconductor structure according to claim 13, wherein
the semiconductor structure further comprises a gate oxide layer, and the gate oxide layer wraps part of the active pillar and is located between the word line and the active pillar.

* * * * *